(12) United States Patent
Son et al.

(10) Patent No.: US 7,339,511 B2
(45) Date of Patent: Mar. 4, 2008

(54) TIME DIVISION SAMPLING DIGITAL TO ANALOG CONVERTER FOR DRIVING FLAT PANEL DISPLAY, METHOD OF IMPLEMENTING THE SAME, AND DATA DRIVER CIRCUIT USING THE SAME

(75) Inventors: Young-Suk Son, Hwasung (KR);
Sang-Kyung Kim, Daejeon (KR);
Gyu-Hyeong Cho, Gongju-si (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 11/367,865

(22) Filed: Mar. 3, 2006

(65) Prior Publication Data
US 2007/0030192 A1 Feb. 8, 2007

(30) Foreign Application Priority Data
Aug. 4, 2005 (KR) ............... 10-2005-0071257

(51) Int. Cl.
*H03M 1/66* (2006.01)
(52) U.S. Cl. ...................... 341/144; 345/76
(58) Field of Classification Search ......... 341/144, 341/141, 122; 345/93, 103, 77
See application file for complete search history.

(56) References Cited

U.S. PATENT DOCUMENTS 5,155,488 A * 10/1992 Takahashi ............... 341/144
6,621,437 B2 * 9/2003 Khalil et al. ............. 341/144
6,977,635 B2 * 12/2005 Ogawa et al. ............. 345/93
2003/0160716 A1 * 8/2003 Murphy .................. 341/144
2006/0077140 A1 * 4/2006 Kwon ..................... 345/77

OTHER PUBLICATIONS

An article entitled, "42.3 Low-power and High . . . ", By Y. Kudo et al., SID 03 DIGEST pp. 1244-1247, (2003).

* cited by examiner

*Primary Examiner*—Peguy JeanPierre
(74) *Attorney, Agent, or Firm*—Bachman & LaPointe, P.C.

(57) ABSTRACT

Disclosed herein are a time division sampling digital to analog converter for a flat panel display, a method of implementing the digital to analog converter, and a data driver circuit using the digital to analog converter. The time division sampling digital to analog converter includes a timing signal generation means for generating timing signals, a data selection means for receiving n-bit digital data, dividing the n-bit digital data into k groups, and outputting the divided digital input data; k reference signal generation means for each outputting $2^{n/k}$ analog reference signals; a reference signal selection means for receiving the outputs of the reference signal generation means and outputting only $2^{n/k}$ analog reference signals selected according to a timing signal from the timing signal generation means; a multiplexer for outputting one of reference signals from the reference signal selection means using the n/k-bit digital data from the data selection means as a control input; and a sampling mode analog addition means for sampling and storing the output of the multiplexer according to a timing signal from the timing signal generation means.

17 Claims, 10 Drawing Sheets

TIME DIVISION SAMPLING DIGITAL TO ANALOG CONVERTER FOR DRIVING FLAT PANEL DISPLAY, METHOD OF IMPLEMENTING THE SAME, AND DATA DRIVER CIRCUIT USING THE SAME

BACKGROUND OF THE INVENTION

1. Field of the Invention

The present invention relates generally to a digital to analog converter for driving a flat panel display and, more particularly, to a time division sampling digital to analog converter for a flat panel display, in which a time division concept and a sampling mode analog addition concept are applied to the structure of a data driver integrated circuit, thereby preventing an increase in chip area due to the implementation of high-resolution driving, a method of implementing the digital to analog converter, and a data driver circuit using the digital to analog converter.

2. Description of the Related Art

Figure 1:
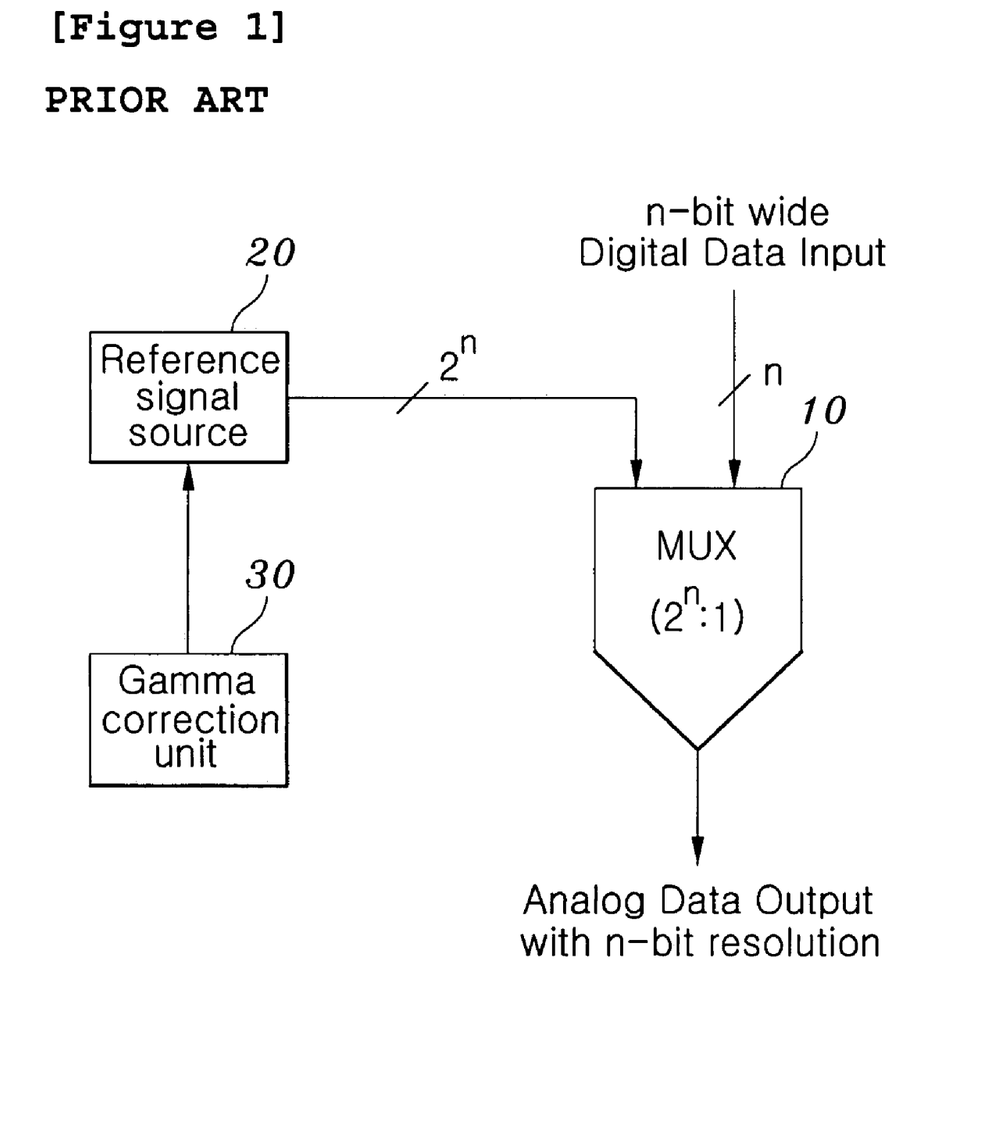
FIG. 1 is a diagram illustrating the construction of the channel DAC of a conventional data driver circuit.

FIG. 1 illustrates the construction of the channel DAC of a conventional data driver circuit. The channel Digital to Analog Converter (DAC) includes a $2^n$:1 multiplexer 10 having an n-bit wide digital data input and $2^n$ analog inputs, a reference signal source 20 having $2^n$ different signal size outputs, a gamma correction unit 30 for correcting the gamma characteristics of the reference signal source 20. The construction of a data driver circuit using the channel DAC is illustrated in FIG. 2.

Figure 2:
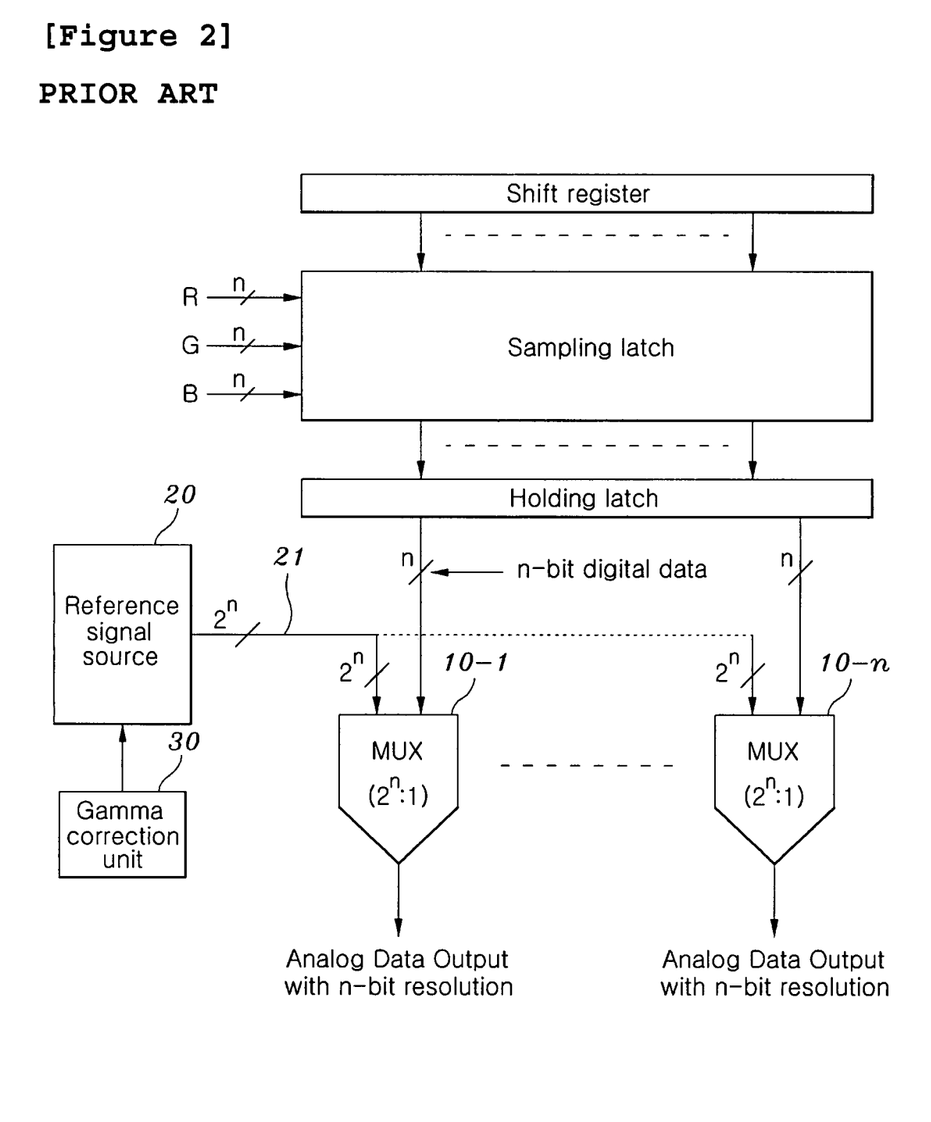
FIG. 2 is a diagram illustrating the construction of a conventional data driver circuit.

In FIG. 2, the multiplexers 10-1, ..., and 10-n of respective data channels share the outputs of a reference signal source 20 via a signal line 21 as analog inputs. The outputs of the multiplexers 10-1, ..., and 10-n may be directly input to a display panel (not shown), or may be input to a display panel via buffers (not shown).

Generally, when the outputs of the reference signal source 20 directly drive a display panel, a buffer is disposed to connect to the outputs of the reference signal source 20. When the buffers are disposed to connect to the outputs of the multiplexers 10-1, ..., and 10-n, a buffer may not be disposed to connect to the outputs of the reference signal source 20. The determination of such a structure depends on the electrostatic capacity of the display panel.

A mechanism for simultaneously outputting n-bit resolution signals (voltage or current) via the respective channels of a data driver circuit generally has the construction shown in FIG. 2.

In a data driver circuit operating at n-bit resolution, the multiplexer 10-1, ..., or 10-n of each channel has an n-bit digital data input and $2^n$ analog inputs, the digital data input is a control input signal for the multiplexer 10-1, ..., or 10-n and functions to output one of the $2^n$ reference signals as the output of the multiplexer 10-1, ..., or 10-n, which is called a Pass Transistor Logic (PTL). The relationships between the digital input data and the analog output signals comply with a predetermined mapping table.

The gamma correction unit 30 allows the relationships between the digital input and output to be adjusted depending on the characteristics of a display panel. The relationships between input digital code values and the output sizes are not linear in the case of the driving of a Liquid Crystal Display (LCD) panel. The gamma correction unit 30 functions to partially tune the relationships.

Meanwhile, a conventional data driver circuit (or source driver circuit) for a flat panel display must independently have a plurality of output data channels. The number of data channels is determined depending on the resolution specifications of the flat panel display. If the number of outputs of a data driver circuit is insufficient, a plurality of data driver circuits is connected in parallel to each other and a high-resolution flat panel display is driven using the data driver circuits connected in parallel.

When a data driver circuit is fabricated using conventional channel DACs, multiplexers provided for respective channels and signal lines adapted to supply signals from the reference signal source for the respective data channels occupy a considerable portion of a data driver Integrated Circuit (IC). Furthermore, if the number of digital data bits is increased to increase color depth, the sizes of the multiplexers and the number of signal lines increase geometrically.

As a result, when the conventional channel DAC structure is employed, the area of the data driver circuit must be increased to increase color depth, so that the degree of integration of the data driver circuit is considerably reduced. That is, in order to maintain the same number of data channels while implementing high resolution, costs, such as an increase in the size of a data driver circuit or a reduction in design rule at the time of manufacturing a data driver IC, may be inevitably incurred.

That is, in order to increase color depth, the size of the data driver IC must be increased, which deteriorates the cost competitiveness of the data driver IC.

SUMMARY OF THE INVENTION

Accordingly, the present invention has been made keeping in mind the above problems occurring in the prior art, and an object of the present invention is to provide a digital to analog converter, which divides input digital data into groups, sequentially generates analog outputs corresponding to the respective groups according to the divided input digital data, and samples and adds the sequentially generated analog data, thus generating an analog output having a desired resolution, so that hardware can be shared through the sequential generation of the analog data and, therefore, an increase in chip area for high resolution driving can be prevented, thus reducing the chip area, a method of implementing the same, and a data driver circuit using the same.

In order to accomplish the above object, the present invention provides a time division sampling digital to analog converter for driving a flat panel display, the converter including a timing signal generation means for generating timing signals that are used to provide operation timing signals for circuit components or to perform synchronization; a data selection means for receiving n-bit digital data as an input, dividing the n-bit digital data into k groups, and outputting the divided digital input data in response to timing signals from the timing signal generator; k reference signal generation means for each outputting $2^{n/k}$ analog reference signals; a reference signal selection means for receiving the outputs of the reference signal generation means as inputs, and outputting only $2^{n/k}$ analog reference signals selected according to a timing signal from the timing signal generation means; a multiplexer for outputting one of reference signals from the reference signal selection means using the n/k-bit digital data from the data selection means as a control input; and a sampling mode analog addition means for sampling and storing the output of the multiplexer according to a timing signal from the timing signal generation means.

The present invention provides a method of implementing a time division sampling analog to digital converter for driving a flat panel display so as to generate an n-bit resolution analog signal from an n-bit digital data input, the method including the steps of dividing the n-bit digital input data into at least two digital data groups; temporally dividing analog values respectively corresponding to the digital data groups; sampling and storing the temporally divided and created analog values; and adding all of the sampled and stored analog values, thus allowing a final analog output signal to have n-bit resolution.

The present invention provides a data driver circuit for driving a flat panel display, to which the digital to analog converter is applied, wherein, when an output of the data driver circuit comprises a predetermined number of output channels, the data selection means, the multiplexer and the sampling mode analog addition means are provided for each of the data channels, an output of the reference signal selection means is shared as inputs of the multiplexers of a predetermined number of data channels, and, therefore, the predetermined number of data channels output final analog signals.

The present invention provides a data driver circuit for driving a flat panel display, to which the digital to analog converter is applied, wherein, when an output of the data driver circuit comprises a predetermined number of output channels, the multiplexer and the sampling mode analog addition means are provided for each of the data channels, digital input data is selectively input to the multiplexer by adjusting operation of a holding latch for inputting the digital data to the multiplexer or a data width and timing of graphic memory according to timing signals from the timing signal generation means for generating timing signals under control of a timing controller, an output of the reference signal selection means is shared as inputs of the multiplexers of a predetermined number of data channels, and, therefore, the predetermined number of data channels output final analog signals.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Reference now should be made to the drawings, in which the same reference numerals are used throughout the different drawings to designate the same or similar components.

Preferred embodiments of the present invention are described in detail with reference to the accompanying drawings. However, the following embodiments are illustrative of the present invention, and the content of the present invention is not limited to the following embodiments.

Figure 3:
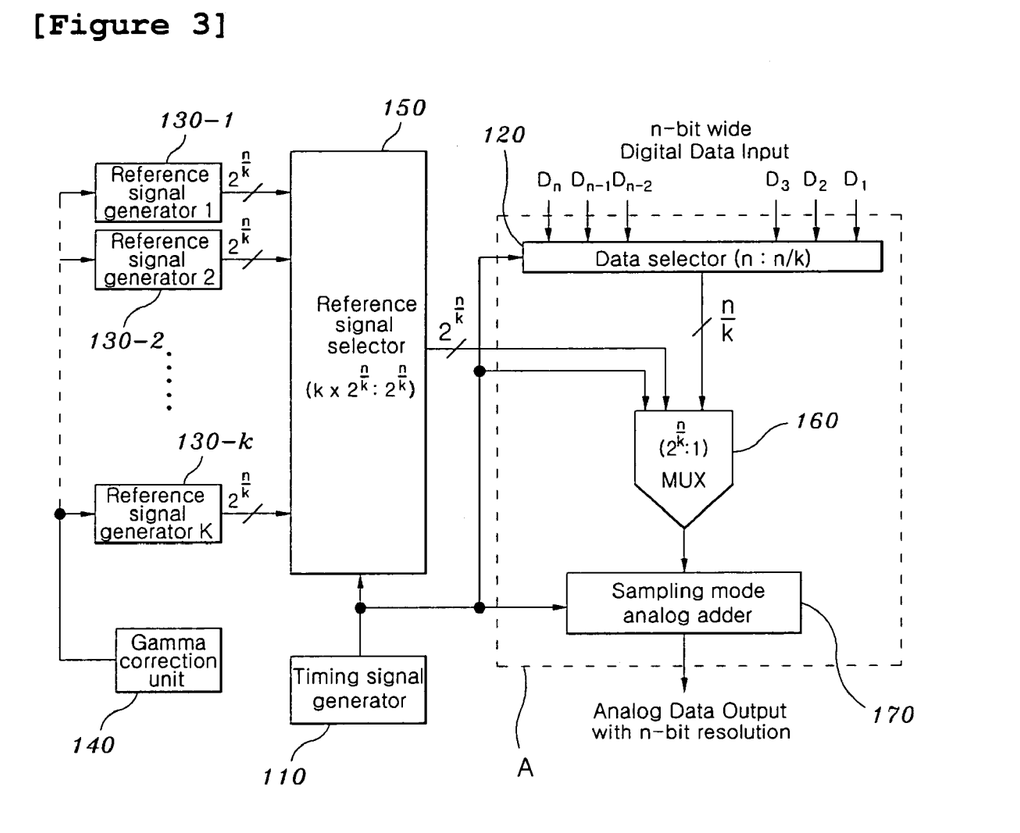
FIG. 3 is a diagram illustrating the configuration of a time division sampling DAC for driving a flat panel display according to the present invention.

FIG. 3 illustrates the construction of a time division sampling DAC for driving a flat panel display according to the present invention.

As illustrated in the drawing, the DAC includes a timing signal generator 110 for generating timing signals to provide operation timing signals for respective components and perform synchronization; a data selector 120 for receiving n-bit digital data as an input, dividing the n-bit digital data into k groups, and outputting the divided input digital data in response to timing signals from the timing signal generator 110; k reference signal generators 130-1, 130-2, . . . , and 130-$k$ for each outputting $2^{n/k}$ analog reference signals; a gamma correction unit 140 for correcting the gamma characteristics of the reference signal generators 130-1, 130-2, . . . , and 130-$k$; a reference signal selector 150 for receiving the outputs (k×$2^{n/k}$ output levels) of the k reference signal generators 130-1, 130-2, . . . , and 130-$k$ and outputting only a single group of reference signals ($2^{n/k}$ output levels) selected according to a timing signal from the timing signal generator 110; a multiplexer 160 for receiving n/k-bit digital data from the data selector 120 as a control input and selecting and outputting one of the reference signals inputs from the reference signal selector 150; and a sampling mode analog adder 170 for sampling and storing the output of the multiplexer 160 in response to a timing signal from the timing signal generator 110.

The timing signal generator 110 is constructed to generate timing signals by itself, or generate timing signals in response to control signals from a controller. Meanwhile, the gamma correction unit 140 may be provided for each of the reference signal generators 130-1, 130-2, . . . , and 130-$k$, or may be provided for all of the reference signal generators 130-1, 130-2, . . . , and 130-$k$.

The technical principle of the present invention constructed as described above resides in dividing a reference signal set and input digital data into k groups to generate analog output voltage (or current) from digital input data, generating appropriate timing signals and sequentially transferring reference signal groups as the output of the reference signal selector 150 one by one in response to respective timing signals, causing one of the reference signals, which are transferred as the output, to be selected by each of the k input digital data values, inputting the value to the sampling mode analog adder 170 via the multiplexer 160, the sampling mode analog adder 170 sampling and storing the input value, and the above-described process is performed k times, thus generating a final n-bit resolution analog signal.

In the present invention, when n-bit digital data is input, the data selector 120 divides n-bit input digital data into k groups, and provides the divided input digital data as the control input of the multiplexer 160 in response to the timing signal from the timing signal generator 110.

The reference signal selector 150 outputs $2^{n/k}$ analog reference signals, which are output from a selected one of the k reference signal generators 130-1, 130-2, . . . , and 130-$k$ that each output $2^{n/k}$ analog reference signals, in response to a timing signal from the timing signal generator 110.

Accordingly, the multiplexer 160 receives n/k-bit digital data from the data selector 120 as a control input and outputs one of the 2n/k analog input signals output from the reference signal selector 150, and the sampling mode analog adder 170 stores the output of the multiplexer 160, adds outputs and causes a final output to have n-bit resolution in response to a timing signal from the timing signal generator 110.

Figure 4:
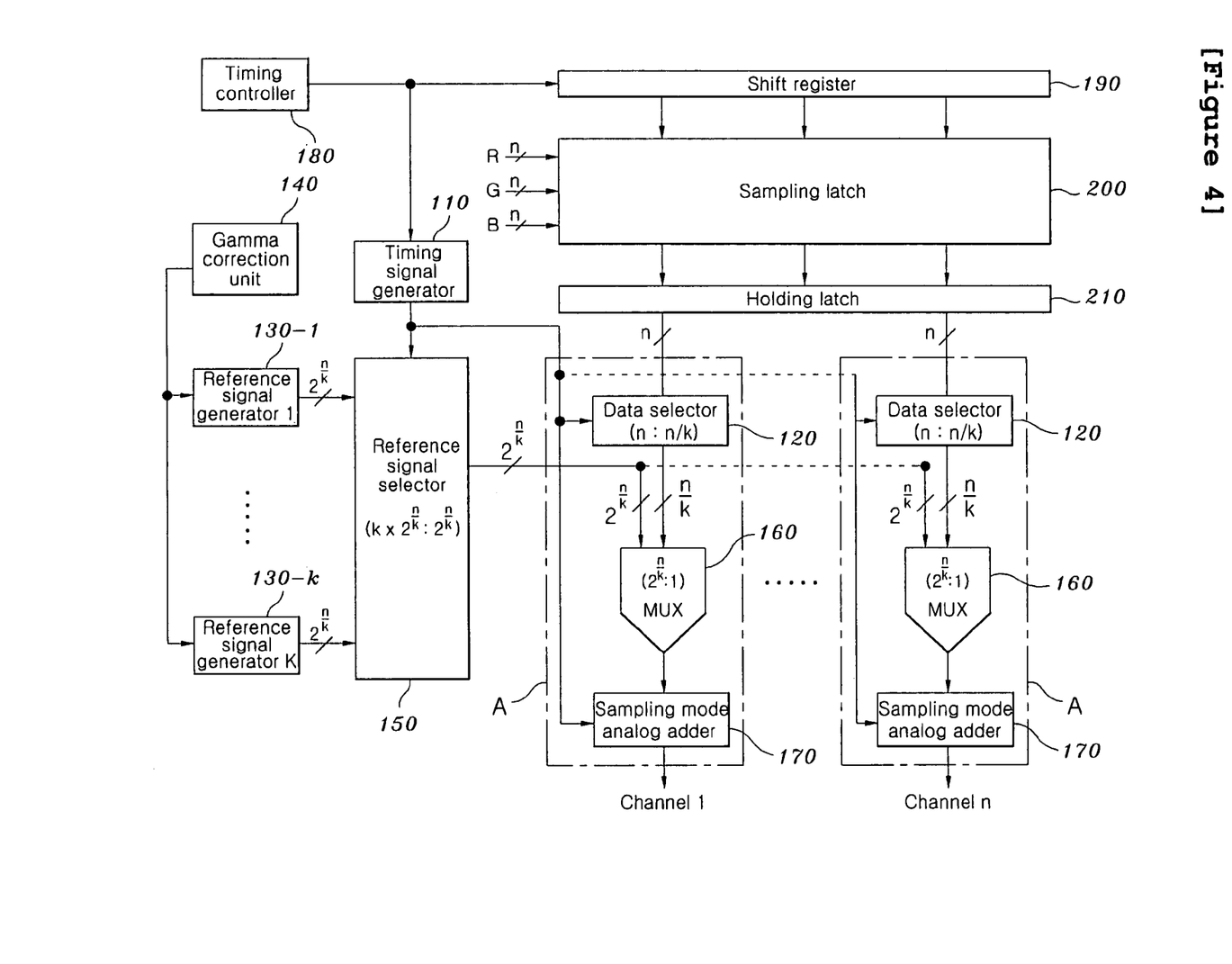
FIG. 4 is a diagram illustrating the configuration of a data driver circuit using the time division sampling DAC of FIG. 3.

FIG. 4 illustrates a data driver circuit using the time division DAC of FIG. 3. A flat panel display (Thin Film Transistor (TFT) LCD panel or Organic Light Emitting Diode (OLED) panel) driver chip set is generally composed of a gate driver IC (or scan driver IC), a timing controller, a Graphic Random Access Memory (GRAM) and a data driver IC (source driver IC), and these four ICs may be integrated into a single IC or parts of the ICs may be integrated. In the present invention, only the timing controller 180 and data driver of the chip set are illustrated and described, as in the data driver circuit of FIG. 4, and it is assumed that the gate driver IC and the graphic memory perform typical operations. Furthermore, in the present invention, the data selector 120, the multiplexer 160, and the sampling mode analog adder 170 together form a basic circuit unit A of each data channel.

The operation of the time division sampling DAC of the present invention and the operation of the data driver circuit in which the DAC of the present invention is applied as a channel DAC are described in detail with reference to the timing charts of FIGS. 5 and 6. In this description, a case where n=4 and k=2 is taken as an example.

Figure 5:
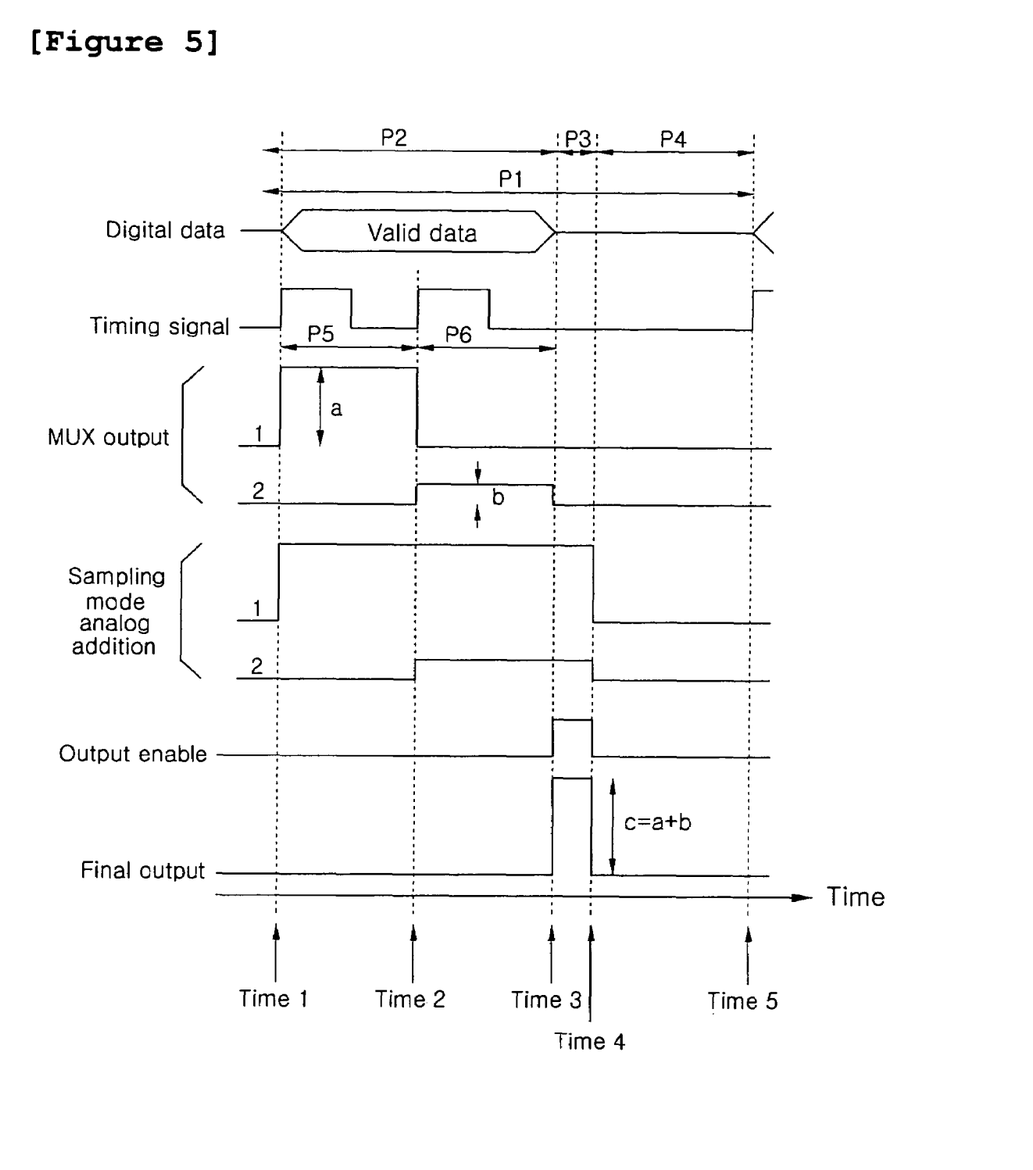
FIG. 5 is an operation timing chart of the present invention.

In FIG. 5, P1 designates a single frame time. Generally, the flat panel display updates displayed information on a frame basis. An update period is called a frame time.

In the DAC structure and driving circuit of the present invention, a frame time or period P1 includes an analog data generation period P2 in which time division sampling is employed, a data program period P3 in which generated analog data is written to the flat panel display, and a valid display period P4.

The analog data generation period P2 is the period for defining the output level of the data driver using the operation of the time division sampling DAC.

Although, in FIG. 5, the period P2 seems to occupy the majority of the frame time, the period P2 is illustrated for convenience of description. In general, in an efficient display system, the period P4 occupies the majority of the frame time, which is the same case in the present invention.

In FIG. 5, the operation of the DAC of FIG. 3 during the period P2 (P5+P6) is described below.

Figure 6:
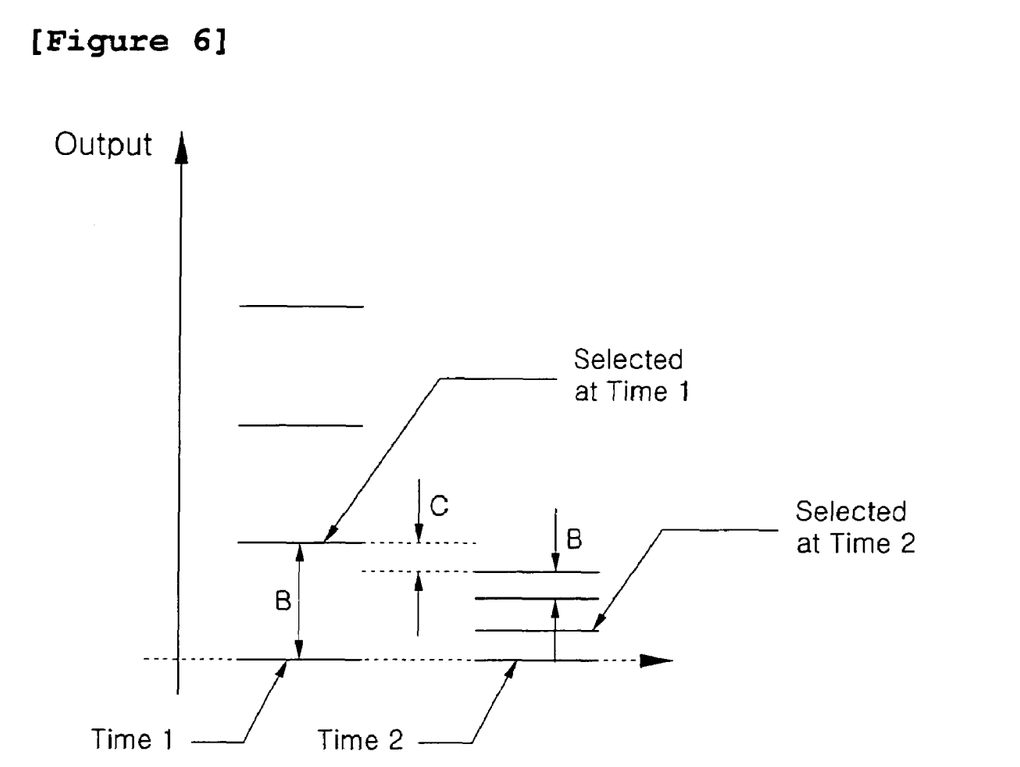
FIG. 6 is an operation timing chart and level diagram of the reference signal selector of FIG. 3.

First, 4-bit input data (n=4) is divided into a 2-bit MSB 1 group and a 2-bit LSB 1 group (k=2), the 2-bit MSB group is input to the control terminal of the multiplexer 160 during the period P5 starting from Time 1, the reference signal generator 150 outputs level-4 analog signals corresponding to the MSB group of FIG. 6 as the analog input of the multiplexer 160, and the multiplexer 160 outputs one of the input level-4 analog signals as the input of the sampling mode analog adder 170 according to MSB data, and the sampling mode analog adder 170 samples and stores the input signal, thereby terminating the period P5 and reaching Time 2.

During the period P6 starting from Time 2, 2-bit LSB data undergoes the same procedure as the 2-bit MSB data, thereby terminating the period P6 and reaching Time 3.

FIG. 6 is an output timing chart of the reference signal selector 150 over time. An analog output corresponding to the MSB group is sampled from the output of the multiplexer 160 and stored, an analog output corresponding to the LSB group is sampled from the output of the multiplexer 160 and stored at Time 2, and the sum of the two signals becomes the final output of the sampling mode analog adder 170 in response to an output enable signal.

Meanwhile, in FIG. 4, a shift register 190 and a sampling latch 200 convert serial data into n-bit parallel data when RGB data is input serially in synchronization with external clocks, and a holding latch 210 maintains the parallel data for the frame time.

Figure 7:
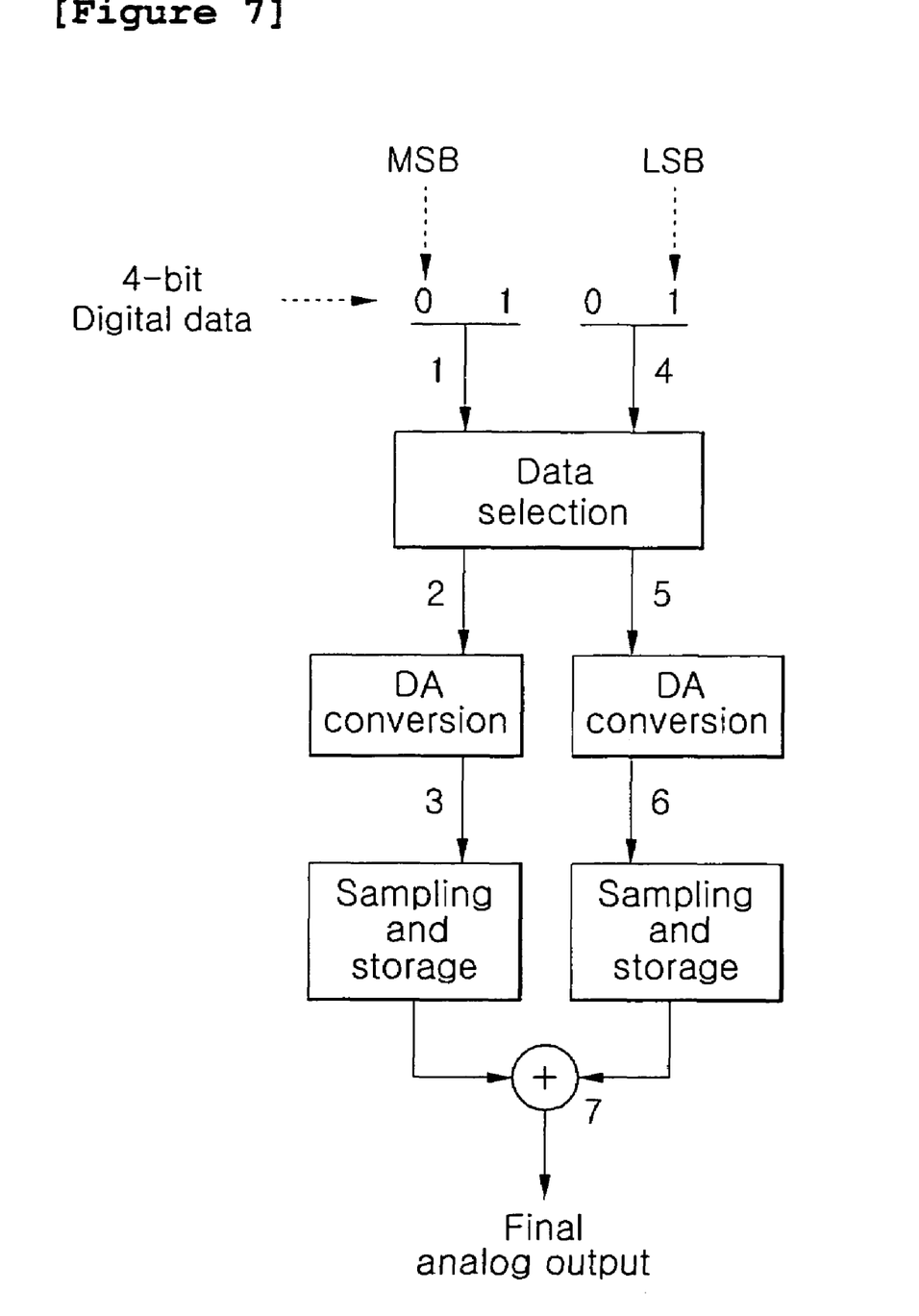
FIG. 7 is a conceptual diagram of the operational procedure of the present invention.

FIG. 7 is a conceptual diagram illustrating the operation of the DAC of the present invention, which operates in the sequence of assigned numbers. That is, the present invention is characterized and advantageous in that the DAC operates in the sequence of 1, 2, 3, 4, 5, 6 and 7, and blocks used in operations 1 to 3 for performing input data selection, DA conversion, sampling and storage can be reused in operations 4 to 6.

Furthermore, in consideration of signal level setting, it is possible to perform operations 4 to 6 (LSB group operations), operations 1 to 3 (MSB group operations), and then operation 7.

Figure 8:
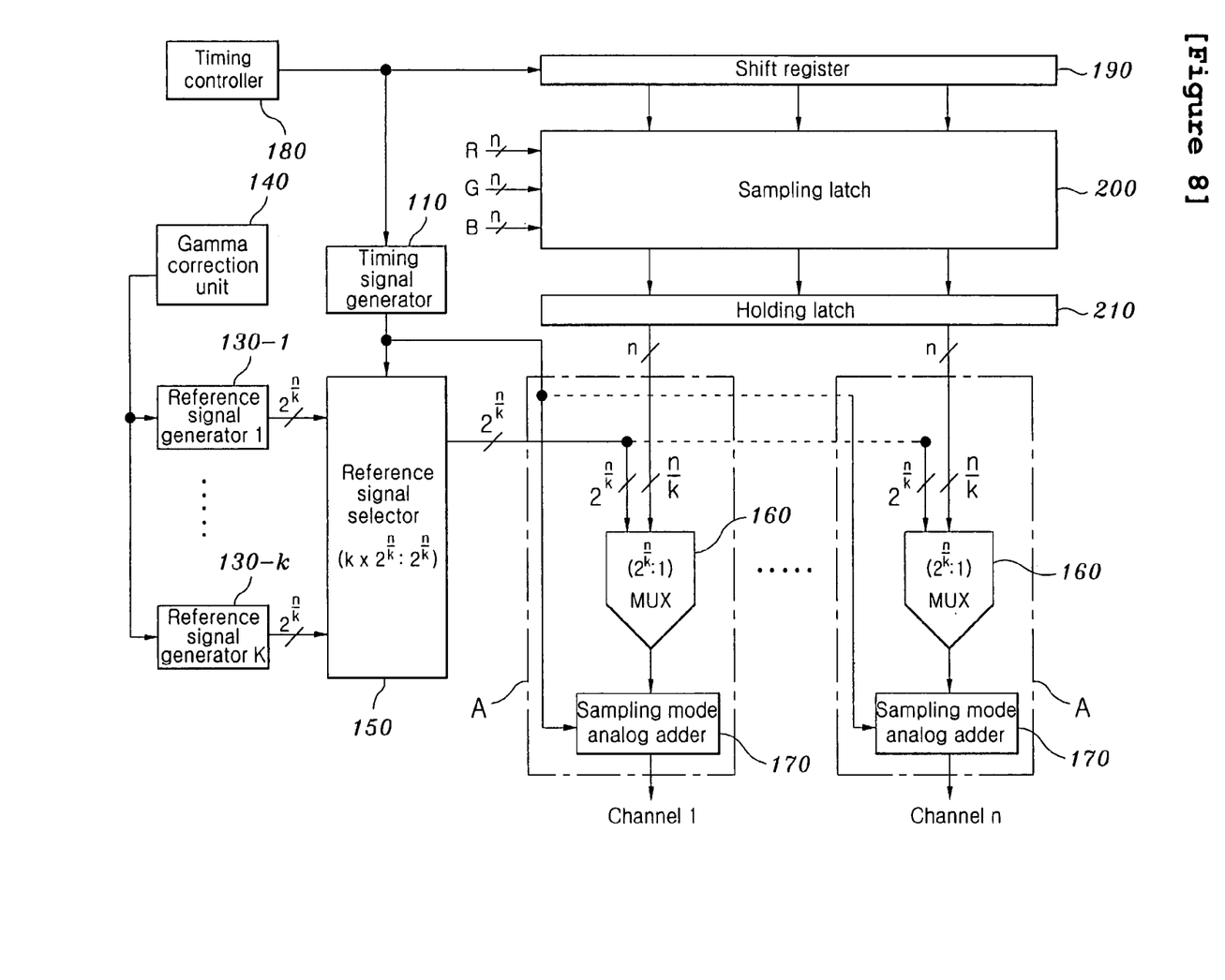
FIG. 8 is a diagram illustrating a data driver circuit using the time division sampling DAC of FIG. 3 according to another embodiment of the present invention.

FIG. 8 shows another example of a data driver circuit using the DAC of the present invention, in which the data selector 120 of FIG. 4 is eliminated by adjusting the operation of the holding latch 210 or the data width and timing of graphic memory (not shown) according to a timing signal from the timing signal generator 110 for generating timing signals under the control of the timing controller 180, so that a simple structure can be achieved.

A case of adjusting the operation of the holding latch 210 is described in brief. Data can be selectively output by adjusting the length of time data is maintained in the holding latch 210 so that the holding latch 210 also serves as the data selector 120 of FIG. 4, as the data selector 120 selectively outputs input digital data.

Meanwhile, a case where, in the present invention, input data is not exactly divided into groups, like a case where n is an odd number and k is an even number, or n is an even number and k is an odd number, is described below.

In this case, problematic parts are the data selector 120, reference signal selector 150 and multiplexer 160 of FIG. 3.

In this case, the sizes of the reference signal selector 150, the data selector 120 and the multiplexer 160 are determined to be suitable for the largest group, based on the number of bits.

A large group (on a bit number basis) is processed as an LSB group, a small group (on a bit number basis) is also processed as an LSB group, and the remaining bits may be processed as an MSB or LSB group.

For example, when n=9 and k=2, data bits are divided into two groups, that is, a 4-bit MSB group and a 5-bit LSB group, a circuit is produced for 5-bit processing, and the 4 bits of the MSB group are processed in such a way as not to use the highest 1-bit of the 5-bit processing circuit.

Meanwhile, the final output using time division sampling DAC of the present invention may be in the form of current or voltage.

In the case of a TFT LCD driver, the output thereof may be in the form of voltage, and in the case of an AMOLED driver, the output thereof may be in the form of current. For the form of current and voltage, only the shape of the sampling mode analog adder 170 varies.

Figure 9:
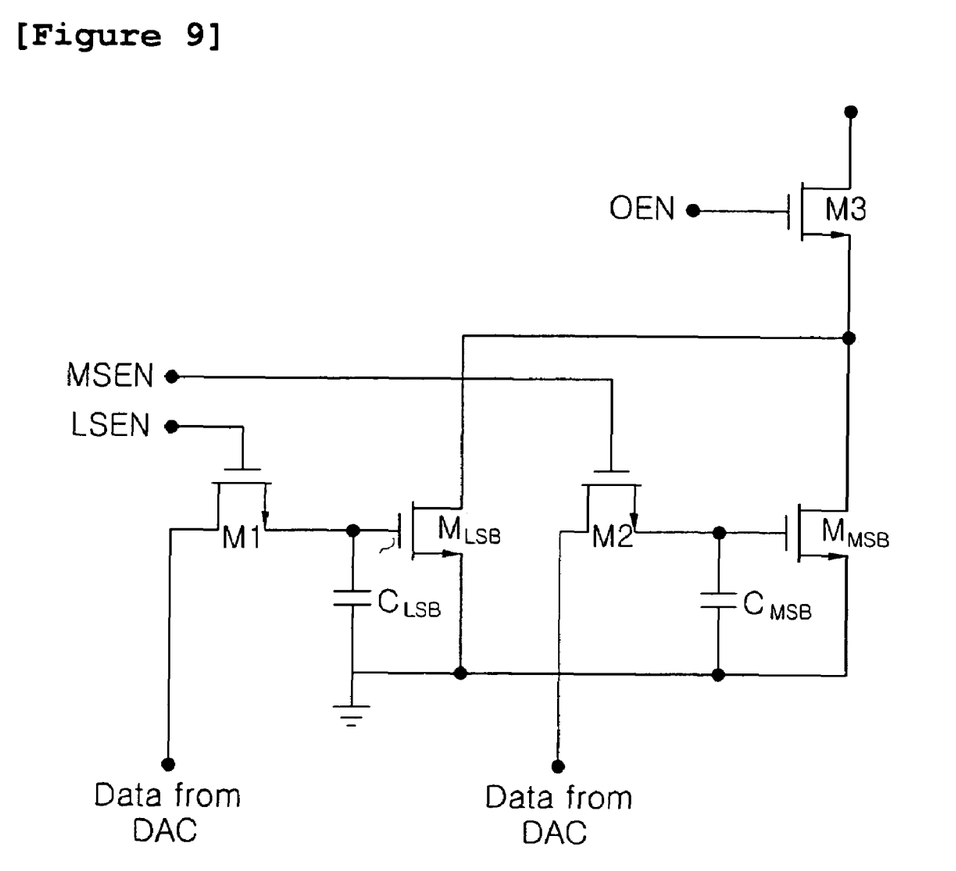
FIGS. 9 and 10 are diagrams illustrating examples of a sampling mode analog adder according to the present invention.
Figure 10:
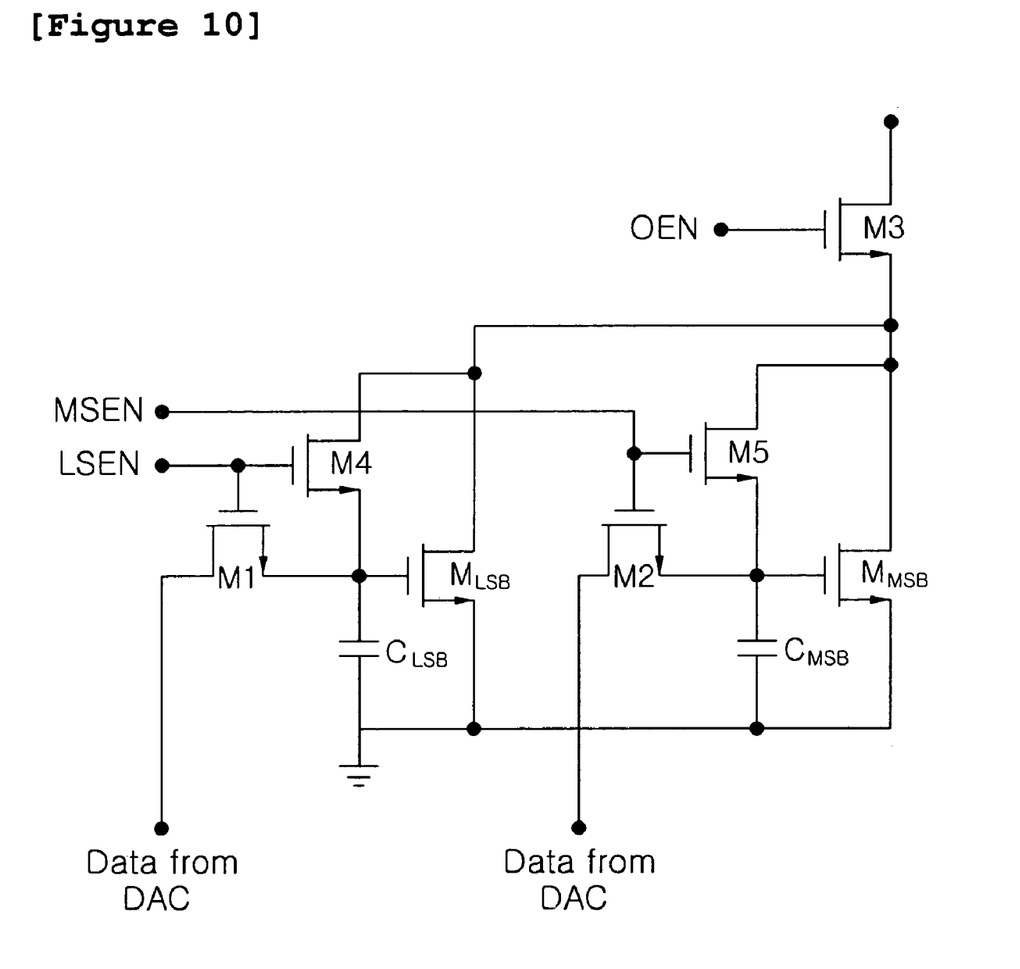

The output of the sampling mode analog adder 170 is in the form of current, and the sampling mode analog adder 170 may be implemented as shown in FIGS. 9 and 10.

FIG. 9 shows a case where current output is a sink type. When NMOS transistors ($M_{LSB}$ and $M_{MSB}$) are converted into PMOS transistors, a source type can be achieved.

MOS transistors M1-M3, respectively connected to LSEN (signal is enabled when an analog signal corresponding to an LSB group is input), MSEN (signal is enabled when an analog signal corresponding to an MSB group is input) and OEN (signal is enabled at the time of final output), function as switches, and can be implemented using NMOS or PMOS transistors. In this case, the LSEN, the MSEN and the OEN are enabled in response to timing signals from the timing signal generator 110.

With respect to the operation thereof, when an analog signal corresponding to LSB is input, the LSEN is enabled and, therefore, the MOS transistor M1 is turned on. Accordingly, voltage that causes current corresponding to the NMOS transistor $M_{LSB}$ to be output is stored in the capacitor $C_{LSB}$, the LSEN is disabled, and the MOS transistor M1 is turned off.

Thereafter, after MSB data has been stored in the capacitor C in the same manner in response to the enabling of the MSEN, the OEN is enabled and, therefore, the MOS transistor M3 is turned on, the final output, that is, the sum of currents corresponding to MSB and LSB, is obtained. Although a final output line is not illustrated, the final output line is the drain terminal of the MOS transistor M3.

A circuit for performing a complementary operation can be simply implemented by converting the NMOS transistors MLSB and MMSB into PMOS transistors.

FIG. 9 illustrates a case where a signal input from the DAC is voltage. A case where the signal is current may be constructed, as illustrated in FIG. 10.

The construction of FIG. 10, compared to the construction of FIG. 9, additionally includes MOS transistors M4 and M5 at the LSEN and MSEN signal input terminals. Since the detailed operation of the construction of FIG. 10 is the same as in the case of the voltage input, a detailed description thereof is omitted here.

When the above-described concept of the present invention is employed, the size of the multiplexer and the number of reference signal lines necessary for the output of analog data having n-bit resolution are respectively $1/(2^{(n-n/k)})$ times as small as those of a structure that does not employ the concept.

For example, assuming that n=10 and k=2, n/k=5 and n−n/k=5. A circuit can be implemented using only a 25:1 multiplexer for each data channel, and the number of reference signal lines is reduced from 256 to 32.

In the case where the present invention is not employed, a $1024(2^{10})$:1 multiplexer must be provided for each data channel, so that it is meaningless in practice to fabricate a high-resolution driving circuit.

As described above, the present invention has the following effects.

First, when the time division sampling DAC structure is employed to implement the DAC, the size of circuitry can not only be reduced, but the accuracy thereof can be improved.

Second, in the fabrication of a data driver IC without resolution, when the time division sampling DAC of the present invention is applied to the driving of data, the size of the multiplexer or PTL that occupies the large portion of the entire area of the driver IC can be reduced to $\frac{1}{2}^{(n-n/k)}$, so that the size of the driver IC can be considerably reduced, which can contribute to the cost competitiveness of the driver IC.

Third, when the time division sampling DAC driving method and circuit configuration of the present invention are employed in the manufacture of data driver ICs, the number of reference signal lines can be reduced from $2^n$ to $2^{n/k}$. Furthermore, the routing area of the reference signal lines can be reduced to $\frac{1}{2}^{(n-n/k)}$ and, therefore, an interference effect can be considerably reduced by the reduction of the routing area, so that improvements can be achieved in terms of both economic and performance aspects. Assuming that n=10 and k=2, n/k=5 and n−n/k=5, so that the number of reference signal lines is reduced from $1024(2^{10})$ to $32(2^5)$, and the routing area is reduced to $\frac{1}{32}(2^5)$.

Fourth, when the time division sampling DAC driving method is applied to the manufacture of a driving IC without a change in resolution, the area required for the multiplexers of respective data channels and reference signal line routing is reduced to at least $\frac{1}{2}^{(n/2)}$ ($k \geq 2$), so that a problem due to an increase in chip area, which occurs at the time of implementing high resolution, can be overcome. As an example, when resolution is increased from n=8 to n=10 and the time division sampling DAC driving method of the present invention is not applied, a 256:1 multiplexer, a 1024:1 multiplexer for 256 reference signal lines, and 1024 reference signal lines are required, and an increase in area is required for the area of a 768:1 multiplexer and the area of 768 reference signal lines. However, when the time division sampling DAC driving method of the present invention in which k=2 is employed, an increased area forms a space only for the area of a 16:1 multiplexer and 16 reference signal lines.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A time division sampling digital to analog converter for driving a flat panel display, the converter comprising:
    timing signal generation means for generating timing signals that are used to provide operation timing signals for circuit components or to perform synchronization;
    data selection means for receiving n-bit digital data as an input, dividing the n-bit digital data into k groups, and outputting the divided digital input data in response to timing signals from the timing signal generator;
    k reference signal generation means for each outputting $2^{n/k}$ analog reference signals;
    reference signal selection means for receiving the outputs of the reference signal generation means as inputs, and outputting only $2^{n/k}$ analog reference signals selected according to a timing signal from the timing signal generation means;
    a multiplexer for outputting one of reference signals from the reference signal selection means using the n/k-bit digital data from the data selection means as a control input; and
    sampling mode analog addition means for sampling and storing the output of the multiplexer according to a timing signal from the timing signal generation means.

2. The digital to analog converter as set forth in claim 1, wherein the data selection means divides the n-bit input digital data into Most Significant Bit (MSB) and Least Significant Bit (LSB) groups.

3. The digital to analog converter as set forth in claim 2, wherein the sampling mode analog addition means, if an output thereof is in a current output form, comprises:
- a first MOS transistor for outputting a current corresponding to an analog voltage signal corresponding to the LSB group;
- a second MOS transistor for outputting a current corresponding to an analog voltage signal corresponding to the MSB group;
- first and second capacitors for storing voltages corresponding to current outputs of the first and second MOS transistors;
- first and second switching elements for performing switching so as to store voltages in the first and second capacitors in response to a signal that is enabled when the analog voltage signal corresponding to the LSB group is input and a signal that is enabled when the analog voltage signal corresponding to the MSB group is input; and
- a third switching element for performing switching in response to a signal that is enabled for a final output of the sampling mode analog addition means and enabling a final output of a sum of the currents corresponding to the LSB and MSB groups.

4. The digital to analog converter as set forth in claim 3, wherein the first to third switching elements are MOS transistors.

5. The digital to analog converter as set forth in claim 3, wherein the signal that is enabled when the analog voltage signal corresponding to the LSB group is input, the signal that is enabled when the analog voltage signal corresponding to the MSB group is input, and the signal that is enabled for the final output of the sampling mode analog addition means are enabled in response to timing signals from the timing signal generation means.

6. The digital to analog converter as set forth in claim 1, wherein, when the input digital data is not divided exactly into the groups, like a case where n is an odd number and k is an even number, or n is an even number and k is an odd number, the data selection means, the reference signal selection means and the multiplexer have sizes that are suitable for a largest group on a bit number basis.

7. The digital to analog converter as set forth in claim 1, wherein k is at least two.

8. A data driver circuit for driving a flat panel display, to which the digital to analog converter of claim 1 is applied, wherein:
when an output of the data driver circuit comprises a predetermined number of output channels, the data selection means, the multiplexer and the sampling mode analog addition means are provided for each of the data channels, an output of the reference signal selection means is shared as inputs of the multiplexers of a predetermined number of data channels, and, therefore, the predetermined number of data channels output final analog signals.

9. A data driver circuit for driving a flat panel display, to which the digital to analog converter of claim 1 is applied, wherein:
when an output of the data driver circuit comprises a predetermined number of output channels, the multiplexer and the sampling mode analog addition means are provided for each of the data channels, digital input data is selectively input to the multiplexer by adjusting operation of a holding latch for inputting the digital data to the multiplexer or a data width and timing of graphic memory according to timing signals from the timing signal generation means for generating timing signals under control of a timing controller, an output of the reference signal selection means is shared as inputs of the multiplexers of a predetermined number of data channels, and, therefore, the predetermined number of data channels output final analog signals.

10. A method of implementing a time division sampling analog to digital converter for driving a flat panel display so as to generate an n-bit resolution analog signal from an n-bit digital data input, the method comprising the steps of:
generating at least one timing signal;
receiving the n-bit digital input;
dividing the n-bit digital input data into at least two digital data groups;
outputting the divided digital input data in response to said at least one timing signal;
outputting an $2^{n/k}$ analog reference signal;
receiving the $2^{n/k}$ analog reference signal as an input;
outputting $2^{n/k}$ analog reference signals selected according to said at least one timing signal;
temporally dividing the $2^{n/k}$ analog reference signals respectively corresponding to the digital data groups;
sampling and storing the temporally divided and created analog reference signals; and
adding all of the sampled and stored analog values, thus allowing a final analog output signal to have n-bit resolution.

11. The digital to analog converter as set forth in claim 10, wherein the digital data group includes MSB and LSB groups into which n-bit digital input data is divided.

12. A time division sampling digital to analog converter for driving a flat panel display, the converter comprising:
timing signal generation means for generating timing signals that are used to provide operation timing signals for circuit components or to perform synchronization;
data selection means for receiving n-bit digital data as an input, dividing the n-bit digital input data into Most Significant Bit (MSB) and Least Significant Bit (LSB) groups, and outputting the divided digital input data in response to timing signals from the timing signal generator;
k reference signal generation means for each outputting $2^{n/k}$ analog reference signals;
reference signal selection means for receiving the outputs of the reference signal generation means as inputs, and outputting only $2^{n/k}$ analog reference signals selected according to a timing signal from the timing signal generation means;
a multiplexer for outputting one of reference signals from the reference signal selection means using the n/k-bit digital data from the data selection means as a control input; and
sampling mode analog addition means for sampling and storing the output of the multiplexer according to a timing signal from the timing signal generation means wherein the sampling mode analog addition means, if an output thereof is in a current output form, comprises:
a first MOS transistor for outputting a current corresponding to an analog voltage signal corresponding to the LSB group;
a second MOS transistor for outputting a current corresponding to an analog voltage signal corresponding to the MSB group;
first and second capacitors for storing voltages corresponding to current outputs of the first and second MOS transistors;

first and second switching elements for performing switching so as to store voltages in the first and second capacitors in response to a signal that is enabled when the analog voltage signal corresponding to the LSB group is input and a signal that is enabled when the analog voltage signal corresponding to the MSB group is input; and a third switching element for performing switching in response to a signal that is enabled for a final output of the sampling mode analog addition means and enabling a final output of a sum of the currents corresponding to the LSB and MSB groups.

13. The digital to analog converter as set forth in claim 12, wherein the first to third switching elements are MOS transistors.

14. The digital to analog converter as set forth in claim 12, wherein the signal that is enabled when the analog voltage signal corresponding to the LSB group is input, the signal that is enabled when the analog voltage signal corresponding to the MSB group is input, and the signal that is enabled for the final output of the sampling mode analog addition means are enabled in response to timing signals from the timing signal generation means.

15. A time division sampling digital to analog converter for driving a flat panel display, the converter comprising:

timing signal generation means for generating timing signals that are used to provide operation timing signals for circuit components or to perform synchronization;

data selection means for receiving n-bit digital data as an input, dividing the n-bit digital data into k groups, and outputting the divided digital input data in response to timing signals from the timing signal generator;

k reference signal generation means for each outputting $2^{n/k}$ analog reference signals;

reference signal selection means for receiving the outputs of the reference signal generation means as inputs, and outputting only $2^{n/k}$ analog reference signals selected according to a timing signal from the timing signal generation means;

a multiplexer for outputting one of reference signals from the reference signal selection means using the n/k-bit digital data from the data selection means as a control input; and sampling mode analog addition means for sampling and storing the output of the multiplexer according to a timing signal from the timing signal generation means, wherein, when the input digital data is not divided exactly into the groups, like a case where n is an odd number and k is an even number, or n is an even number and k is an odd number, the data selection means, the reference signal selection means and the multiplexer have sizes that are suitable for a largest group on a bit number basis.

16. A data driver circuit for driving a flat panel display, comprising:

a time division sampling digital to analog converter comprising:

timing signal generation means for generating timing signals that are used to provide operation timing signals for circuit components or to perform synchronization;

data selection means for receiving n-bit digital data as an input, dividing the n-bit digital data into k groups, and outputting the divided digital input data in response to timing signals from the timing signal generator;

k reference signal generation means for each outputting $2^{n/k}$ analog reference signals;

reference signal selection means for receiving the outputs of the reference signal generation means as inputs, and outputting only $2^{n/k}$ analog reference signals selected according to a timing signal from the timing signal generation means;

a multiplexer for outputting one of reference signals from the reference signal selection means using the n/k-bit digital data from the data selection means as a control input; and sampling mode analog addition means for sampling and storing the output of the multiplexer according to a timing signal from the timing signal generation means; and when an output of the data driver circuit comprises a predetermined number of output channels, the data selection means, the multiplexer and the sampling mode analog addition means are provided for each of the data channels, an output of the reference signal selection means is shared as inputs of the multiplexers of a predetermined number of data channels, and, therefore, the predetermined number of data channels output final analog signals.

17. A data driver circuit for driving a flat panel display, comprising:

a time division sampling digital to analog converter comprising:

timing signal generation means for generating timing signals that are used to provide operation timing signals for circuit components or to perform synchronization;

data selection means for receiving n-bit digital data as an input, dividing the n-bit digital data into k groups, and outputting the divided digital input data in response to timing signals from the timing signal generator;

k reference signal generation means for each outputting $2^{n/k}$ analog reference signals;

reference signal selection means for receiving the outputs of the reference signal generation means as inputs, and outputting only $2^{n/k}$ analog reference signals selected according to a timing signal from the timing signal generation means;

a multiplexer for outputting one of reference signals from the reference signal selection means using the n/k-bit digital data from the data selection means as a control input; and sampling mode analog addition means for sampling and storing the output of the multiplexer according to a timing signal from the timing signal generation means; and when an output of the data driver circuit comprises a predetermined number of output channels, the multiplexer and the sampling mode analog addition means are provided for each of the data channels, digital input data is selectively input to the multiplexer by adjusting operation of a holding latch for inputting the digital data to the multiplexer or a data width and timing of graphic memory according to timing signals from the timing signal generation means for generating timing signals under control of a timing controller, an output of the reference signal selection means is shared as inputs of the multiplexers of a predetermined number of data channels, and, therefore, the predetermined number of data channels output final analog signals.

* * * * *